United States Patent [19]
Lee et al.

[11] Patent Number: 5,851,853
[45] Date of Patent: Dec. 22, 1998

[54] METHOD OF ATTACHING A DIE ONTO A PAD OF A LEAD FRAME

[75] Inventors: Hwa Young Lee; Jong Keun Jun; Tae Hyuk Kim; Jae Won Lee, all of Chungcheongnam-do, Rep. of Korea

[73] Assignee: Samsung Electronics Co., Ltd., Suwon, Rep. of Korea

[21] Appl. No.: 632,050

[22] Filed: Apr. 15, 1996

[30] Foreign Application Priority Data

Oct. 17, 1995 [KR] Rep. of Korea .................. 1995 35777

[51] Int. Cl.$^6$ .................................................. H01L 21/44
[52] U.S. Cl. ............................................. 438/108; 438/118
[58] Field of Search ..................................... 437/209, 211, 437/214, 220; 156/330, 497; 427/348; 438/108, 118

[56] References Cited

U.S. PATENT DOCUMENTS

| | | | |
|---|---|---|---|
| 4,642,158 | 2/1987 | Steinel et al. | 156/497 |
| 4,778,642 | 10/1988 | Lee et al. | 427/348 |
| 5,423,889 | 6/1995 | Colquitt et al. | 437/220 |

OTHER PUBLICATIONS

"Microelectronics Packaging Handbook",edited by Rao R. Tummala and Eugene J. Rymaszewski, Van Nostrand Reinhold, No Date.

"Electronic Materials Handbook" vol. 1, Packaging, Prepared under the direction of the ASM International Handbook Committee, No Date.

*Primary Examiner*—Kevin Picardat
*Attorney, Agent, or Firm*—Jones & Volentine, L.L.P.

[57] ABSTRACT

An improved method of attaching a semiconductor chip onto a die pad of a lead frame using an epoxy adhesive by dispensing the epoxy adhesive onto the die pad, decreasing a viscosity of the epoxy adhesive dispensed onto the die pad by blowing a hot gas over at least part of the epoxy adhesive thereby preventing a formation of an epoxy tail, and placing the chip into the adhesive to attach the chip to the die pad. The hot gas used may be air or nitrogen, having a temperature from 50° C. to 70° C. The hot gas is blown from a blower between the die pad and the dispenser, and may be blown onto the epoxy adhesive from more than one direction.

15 Claims, 3 Drawing Sheets

METHOD OF ATTACHING A DIE ONTO A PAD OF A LEAD FRAME

BACKGROUND OF THE INVENTION

The present invention relates generally to a method of assembling semiconductor chip package. In particular, the present invention relates to an improved method of attaching an individual semiconductor chip to a die pad of a lead frame.

A process of "die attachment" is a step in the manufacture of semiconductor chips wherein individual chips ("dice"), which are produced by sawing a wafer, are attached to a die pad of a lead frame.

Die-attachment materials may be divided into two classes: soft and hard adhesives. Soft adhesives include a lead-based eutectic solder and organic adhesives such as epoxy or polyimide resin filled with thermal conductive particles. Hard adhesives include eutectic mainly composed of gold, for example AuSi, AuSn, AuGe and the like. These adhesives bond the chip to the pad and relieve stress on the chip. A large part of stress on the chip due to a thermal difference between the chip and the lead frame. The adhesive absorbs much of this thermal difference, allowing only a small amount of the stress to be transferred to the chip.

For the assembly of plastic packages, an epoxy filled with silver ("Ag-epoxy") is widely employed as a die-attach adhesive. The use of silver (Ag) is desirable since silver is a good thermal conductor.

FIG. 1 is a partial schematic view of a conventional dispensing mechanism employed for dispensing die-attach adhesive onto a pad of the lead frame. The dispensing mechanism 8 comprises a syringe 7 (or tube) containing an adhesive 2, such as Ag-epoxy, and a dotter 5 for dispensing the adhesive 2. The syringe 7 sits above a die pad 6 of a lead frame 4 and dispenses a specific amount of the adhesive 2 onto the die pad 6. Although not shown in FIG. 1, a semiconductor chip is placed in the adhesive 2, and is seated in the adhesive under thermal atmosphere to a desired bondline thickness.

Since Ag-epoxy has a certain viscosity, an epoxy tail 9 (or "epoxy bridge") is formed between the dispensing mechanism 8 and Ag-epoxy dispensed onto the die pad 6. This epoxy tail 9 results in electrical shorts or epoxy contaminations of the lead or the die.

FIG. 2 is a graph of how the viscosity of one kind of Ag-epoxy adhesive changes with varying ambient temperatures. As shown in FIG. 2, Ag-epoxy has a viscosity that is inversely proportional to the temperature. The die attachment process using Ag-epoxy is usually carried out at the temperature from 23° C. to 25° C., which results in a fairly high viscosity. This high viscosity in turn results in a larger epoxy tail 9, since the higher the viscosity of Ag-epoxy, the larger the epoxy tail 9 formed, and the lower the viscosity of the Ag-epoxy, the smaller the epoxy tail 9 formed. Accordingly, the formation of the epoxy tail 9 can be reduced by reducing the viscosity of adhesive 2, i.e., the Ag-epoxy, contained in the syringe 7. However, the viscosity of Ag-epoxy can not be decreased below a certain value, because below a certain viscosity the Ag-epoxy runs and thus becomes unsuitable for the dispenser and as an adhesive.

SUMMARY OF THE INVENTION

It is an object of the invention to provide a method of attaching a semiconductor chip onto a die pad of a lead frame, which method avoids or reduces the formation of an epoxy tail during a die attachment process. By avoiding the creation of an epoxy tail, this method also helps prevent electrical failures resulting from the formation of the epoxy tail.

This object can be accomplished by a method of attaching a semiconductor chip onto a die pad of a lead frame using an epoxy adhesive, comprising the steps of: dispensing the epoxy adhesive onto the die pad; decreasing a viscosity of the epoxy adhesive dispensed onto the die pad by blowing a hot gas over at least part of the epoxy adhesive thereby preventing a formation of an epoxy tail; and placing the chip into the adhesive to attach the chip to the die pad.

The hot gas may be air or nitrogen, preferably at a temperature from 50° C. to 70° C. . The higher temperature is desirable since it will decrease the viscosity of the a variety of epoxy adhesives including an Ag-epoxy adhesive.

The hot gas is blown from a blower between the die pad and the dispenser, which may blow hot gas onto the epoxy adhesive from more than one direction. The epoxy adhesive is preferably an epoxy resin filled with silver that is dispensed by dotting it onto an upper surface of the die pad.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS OF THE INVENTION

The present invention will now be described in more detail with reference to accompanying drawings.

Figure 3:
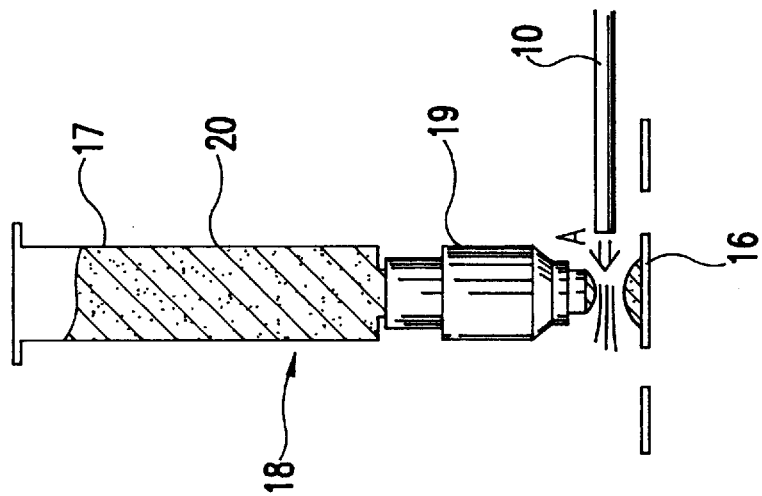
FIG. 3 is a schematic diagram of a die attachment process using Ag-epoxy according to a first preferred embodiment of the present invention.
Figure 1:
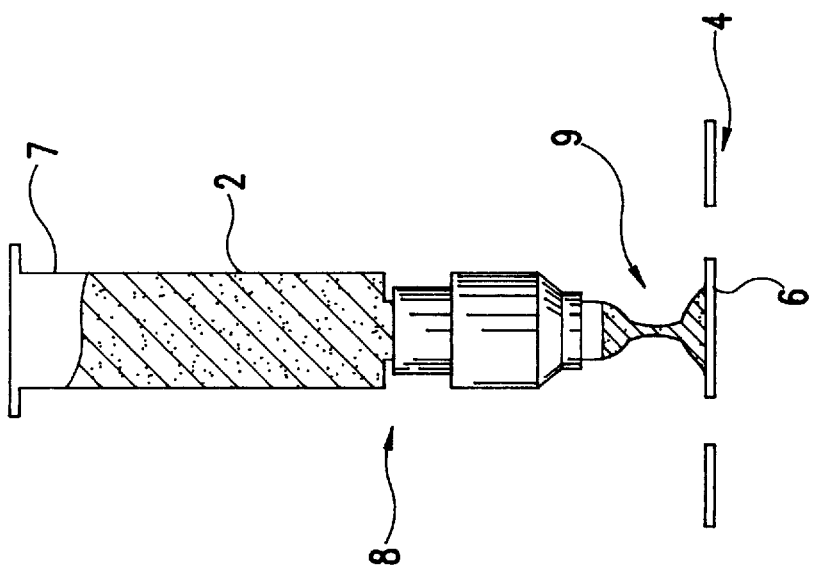
FIG. 1 is a partial schematic view of a conventional coating equipment employed for die attachment using an Ag-epoxy.
Figure 2:
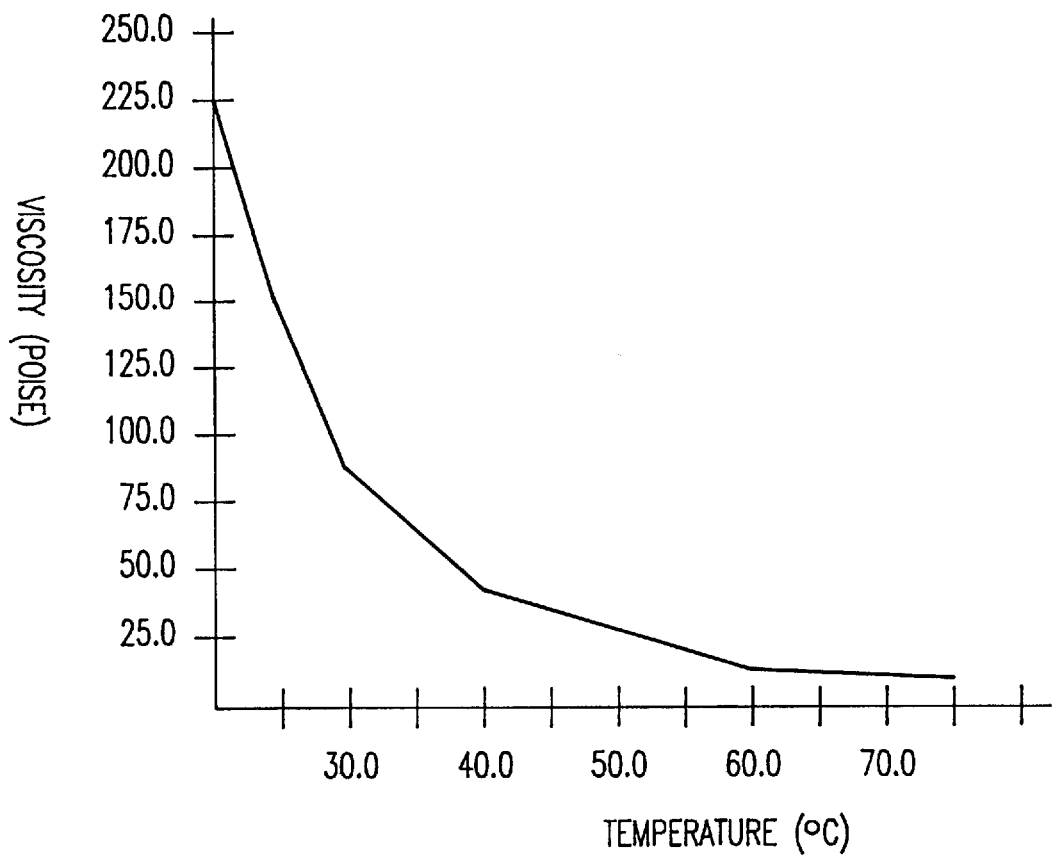
FIG. 2 shows a change in viscosity of Ag-epoxy depending on the temperature.

FIG. 3 is a schematic diagram of a die attachment process using an adhesive, such as an Ag-epoxy, according to a first preferred embodiment of the present invention. The dispensing mechanism 18 ("dot-dispenser") for dispensing the adhesive 2 comprises a syringe 17 containing the adhesive 2 and a dotter 15 for dispensing dots of the adhesive 2 in a specific amount. The adhesive is preferably an epoxy adhesive, and is more preferably an Ag-epoxy adhesive. The dot-dispenser 18 sits above a die pad 16 of a lead frame 14 and dispenses dots of the adhesive 2 onto the die pad 16. When the adhesive 2 is dispensed, hot air A is blown through a blower 10 onto the adhesive 2 running from the dotter 15 to the die pad 16. The temperature of the hot air A is preferably in the range of 50° C. to 70° C. The hot air A reduces the viscosity of the adhesive thereby inhibiting the formation of an epoxy tail. In the case of an Ag-epoxy, a temperature in the range of 50° C. to 70° C. can reduce the epoxy's viscosity to about 30 poise or less.

Although FIG. 3 depicts an embodiment in which the hot air A is blown from one direction only, the air may be blown from two or more directions to effectively reduce the viscosity of the adhesive.

Although regular air is used as the heating gas in the preferred embodiment, nitrogen ($N_2$) or any other suitable gas that may be safely blown in a temperature ranging from 50° C. to 70° C. may be employed instead of air.

Figure 4A:
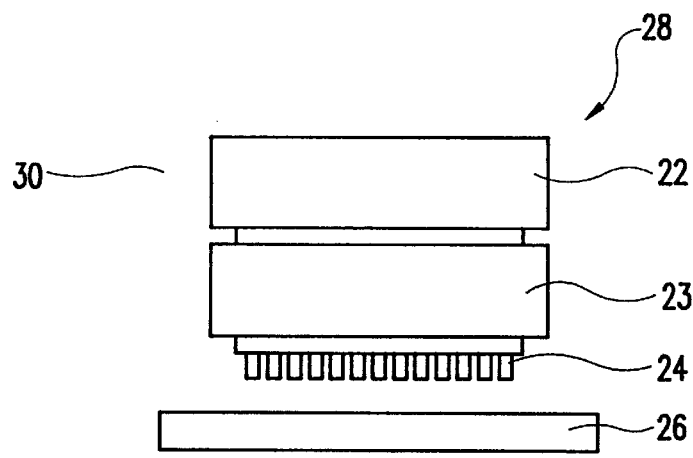
FIGS. 4A through 4C are schematic diagram showing the coating of Ag-epoxy adhesive according to a second preferred embodiment of the present invention.
Figure 4B:
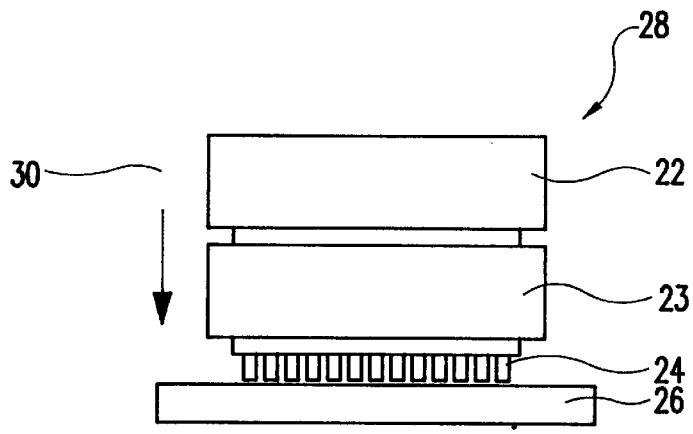
Figure 4C:
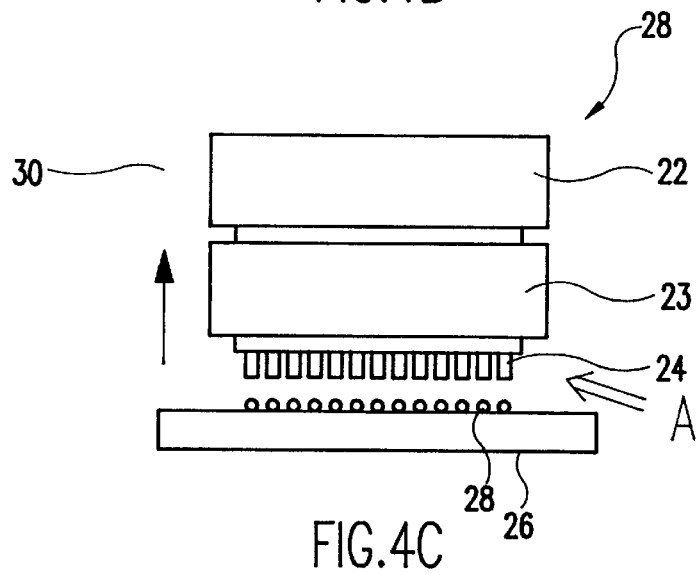

FIGS. 4A through 4C are schematic diagram showing the dispensing of dots of an adhesive according to a second preferred embodiment of the present invention. The dispensing mechanism 28 (or "dot dispenser") comprises a syringe 30 containing an adhesive 2 and a dotter 23 for dispensing dots of the adhesive 2 onto the die pad 26. The dotter 23 is provided with a plurality of nozzles 24 for depositing a plurality of dots of adhesive. This permits a more efficient dotting of the adhesive by effectively spreading the adhesive out more evenly.

With reference to FIG. 4A, the dispensing mechanism 28 is initially placed above the die pad 26. Then, as shown in FIG. 4B, the dotter 23 is moved to downward to a position close to one surface of the die pad 26. As shown in FIG. 4C, the syringe 30 is then pressurized and the adhesive 2 is dispensed from the nozzle 24 onto the die pad 26. As also shown in FIG. 4C, after the adhesive 2 is dispensed, a hot gas A, such as hot air or hot nitrogen gas is blown onto the adhesive 2 running from the nozzle to the die pad. This hot gas A reduces the viscosity of the adhesive and effectively prevents the formation of an epoxy tail. The adhesive used is preferably an epoxy adhesive and is more preferably an Ag-epoxy. The temperature of the hot gas A is preferably in the range of 50° C. to 70° C.

As described above, the formation of an epoxy tail, which can result in epoxy-on-lead or epoxy-on-die failures, can be effectively prevented by blowing hot gas onto the adhesive dotted from the dispensing equipment to the die pad during a die attachment process. The epoxy tail is eliminated by reducing the viscosity of the adhesive 2. However, the viscosity is not reduced when the adhesive 2 is in the syringe 30, but rather once it is dispensed on the die pad 26. In this allows the adhesive to be brought to a viscosity low enough to reduce or eliminate the epoxy tail 9, without the need to consider whether the viscosity will be too low to effectively be dispensed by the syringe 30.

Although preferred embodiments of the present invention have been described above in detail, it should be clearly understood that many variations and modifications of the basic inventive concepts herein taught which my appear to those skilled in the art will still fall within the spirit and scope of the present invention as defined in the appended claims.

What is claimed:

1. A method of attaching a semiconductor chip onto a die pad of a lead frame using an epoxy adhesive, comprising the steps of:

dispensing the epoxy adhesive onto the die pad;

decreasing a viscosity of the epoxy adhesive dispensed onto the die pad by blowing a hot gas over at least part of the epoxy adhesive thereby preventing a formation of an epoxy tail, while preventing the hot gas from being blown directly onto the die pad; and placing the chip into the adhesive to attach the chip to the die pad.

2. The method of claim 1, wherein the hot gas is air or nitrogen.

3. The method of claim 1, wherein the hot gas has a temperature from 50° C. to 70° C.

4. The method of claim 1, wherein the hot gas is blown from a blower between the die pad and the dispenser.

5. The method of claim 4, wherein the hot gas is blown onto the epoxy adhesive from more than one direction.

6. The method of claim 1, wherein the epoxy adhesive is an epoxy resin filled with silver.

7. The method of claim 1, wherein said epoxy adhesive is dispensed by dotting it onto an upper surface of the die pad.

8. A method of attaching a semiconductor chip onto a die pad of a lead frame using an epoxy adhesive, as recited in claim 1, wherein the step of decreasing the viscosity of the epoxy adhesive dispensed onto the die pad is accomplished by blowing the hot gas horizontally over at least part of the epoxy adhesive.

9. An improved method of attaching a semiconductor chip onto a die pad of a lead frame using an epoxy adhesive, comprising the steps of:

dispensing a plurality of dots of the epoxy adhesive onto the die pad;

decreasing a viscosity of the plurality of dots of epoxy adhesive by blowing a hot gas over at least part of the plurality of dots thereby preventing a formation of epoxy tails, while preventing the hot gas from being blown directly onto the die pad; and placing the chip into the plurality of dots of epoxy adhesive to attach the chip to the die pad.

10. The method of claim 9, wherein the hot gas is air or nitrogen.

11. The method of claim 9, wherein the hot gas has a temperature from 50° C. to 70° C.

12. The method of claim 9, wherein the hot gas is blown from a blower between the die pad and the dispenser.

13. The method of claim 12, wherein the hot gas is blown onto the plurality of dots of epoxy adhesive from more than one direction.

14. The method of claim 9, wherein the epoxy adhesive is an epoxy resin filled with silver.

15. An improved method of attaching a semiconductor chip onto a die pad of a lead frame using an epoxy adhesive, as recited in claim 9, wherein the step of decreasing the viscosity of the plurality of dots adhesive is accomplished by blowing the hot gas horizontally over at least part of the plurality of dots.

* * * * *